(12) United States Patent
Chen et al.

(10) Patent No.: US 9,247,635 B2
(45) Date of Patent: Jan. 26, 2016

(54) FLEXIBLE SUBSTRATE

(71) Applicant: CHIPBOND TECHNOLOGY CORPORATION, Hsinchu (TW)

(72) Inventors: Yi-Wen Chen, Changhua County (TW); Yin-Chen Lin, Miaoli County (TW); Ming-Hsiao Ke, Hsinchu (TW); Yu-Chen Ma, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 77 days.

(21) Appl. No.: 14/317,254

(22) Filed: Jun. 27, 2014

(65) Prior Publication Data

US 2015/0359085 A1 Dec. 10, 2015

(30) Foreign Application Priority Data

Jun. 9, 2014 (TW) .............................. 103119907 A

(51) Int. Cl.
*H05K 1/00* (2006.01)
*H05K 1/02* (2006.01)

(52) U.S. Cl.
CPC .............. *H05K 1/0269* (2013.01); *H05K 1/028* (2013.01); *H05K 1/0274* (2013.01); *H05K 1/0298* (2013.01)

(58) Field of Classification Search
USPC .................................. 361/749, 750; 174/251
See application file for complete search history.

(56) References Cited

U.S. PATENT DOCUMENTS

| | | | | |
|---|---|---|---|---|
| 4,815,981 A | * | 3/1989 | Mizuno | H05K 1/118 439/77 |
| 2002/0008966 A1 | * | 1/2002 | Fjelstad et al. | G01R 1/0466 361/760 |

FOREIGN PATENT DOCUMENTS

| | | |
|---|---|---|
| JP | 2-81076 | 6/1990 |
| JP | 10-200217 | 7/1998 |
| JP | 2008-65517 | 3/2008 |
| JP | 2010-225843 | 10/2010 |
| TW | 591987 | 6/2004 |

OTHER PUBLICATIONS

Japanese Office Action mailed Jan. 29, 2015 for Japanese Patent Application No. 2014-128295, 3 pages.
Taiwanese Office Action mailed Oct. 17, 2014 for Taiwanese Patent Application No. 103119907, 5 pages.

* cited by examiner

*Primary Examiner* — Andargie M Aychillhum
(74) *Attorney, Agent, or Firm* — Jackson IPG PLLC; Demian K. Jackson

(57) ABSTRACT

A flexible substrate includes a base layer, a metallic layer, a solder mask layer and an identifying code, the metallic layer is disposed at a first surface of the base layer, the metallic layer comprises a plurality of traces and at least one bottom block used for defining marked position, wherein the traces and the at least one bottom block are covered with the solder mask layer, wherein above the perpendicular direction of the at least one bottom block of the metallic layer, a pre-marked area is defined on an exposing surface of the solder mask layer and by an outlined edge of the at least one bottom block, and the identifying code is formed within the pre-marked area of the solder mask layer.

9 Claims, 6 Drawing Sheets

FLEXIBLE SUBSTRATE

FIELD OF THE INVENTION

The present invention is generally relating to a flexible substrate, more particularly to the flexible substrate that identifies identifying code of product easily.

BACKGROUND OF THE INVENTION

With reference to FIG. 6, a conventional flexible substrate 10 includes a base layer 11 and a trace layer 12, wherein the base layer 11 comprises a first surface 11a and a second surface 11b, the trace layer 12 is disposed on the first surface 11a of the base layer 11, and an identifying code 13 is formed on the second surface 11b of the base layer 11 by means of printing for manual interpretation or photography interpretation. However, owing to the identifying code 13 formed on the second surface 11b of the base layer 11, when one is about to interpret the identifying code 13, the flexible substrate 10 has to be reversed and thereafter proceeds interpretation via the second surface 11b of the base layer 11. Therefore, the interpretation time has increased.

Besides, the position of the identifying code 13 formed on the second surface 11b of the base layer 11 for each manufacturer is different, and the handwriting of the identifying code 13 is tiny. For mentioned reasons, the identifying code 13 is difficult to be distinguished.

SUMMARY

The primary object of the present invention is to provide a flexible substrate, wherein a pre-marked area is defined on an exposing surface of a solder mask layer and via a bottom block of a metallic layer so that an identifying code is formed within the pre-marked area of the solder mask layer.

A flexible substrate includes a base layer, a metallic layer, a solder mask layer and an identifying code, wherein the base layer comprises a first surface and a second surface opposite to the first surface, the metallic layer formed on the first surface of the base layer comprises a plurality of traces and at least one bottom block for defining marked position, the solder mask layer is a material that is pervious to light and comprises an exposing surface, wherein the traces and the at least one bottom block are covered with the solder mask layer, wherein a pre-marked area is defined on the exposing surface of the solder mask layer and by an outlined edge of the at least one bottom block, the pre-marked area is located above the perpendicular direction of the bottom block of the metallic layer, and the range of the pre-marked area is defined by projection of the outlined edge of the at least one bottom block. The shape of the pre-marked area is the same with that of the at least one bottom block. The identifying code is formed within the pre-marked area of the solder mask layer.

Before formation of the identifying code, the solder mask layer is a material that is pervious to light, and the pre-marked area is defined on the exposing surface of the solder mask layer and by the outlined edge of the at least one bottom block. For mentioned reasons, the operator may identify the position desired to be marked easily so as to form the identifying code within the pre-marked area. After forming the identifying code, the inspector or the operator may find out the position of the at least one bottom block in the flexible substrate easily and rapidly so as to identify the identifying code within the pre-marked area.

In this invention, via the at least one bottom block, the time for the inspector or the operator to look for the marked position of the identifying code can be saved. Besides, the identifying code takes the at least one bottom block as supporting base for making the identifying code become clear to prevent manual interpretation or photography apparatus interpretation from wrong judgment.

DETAILED DESCRIPTION OF THE INVENTION

Figure 1:
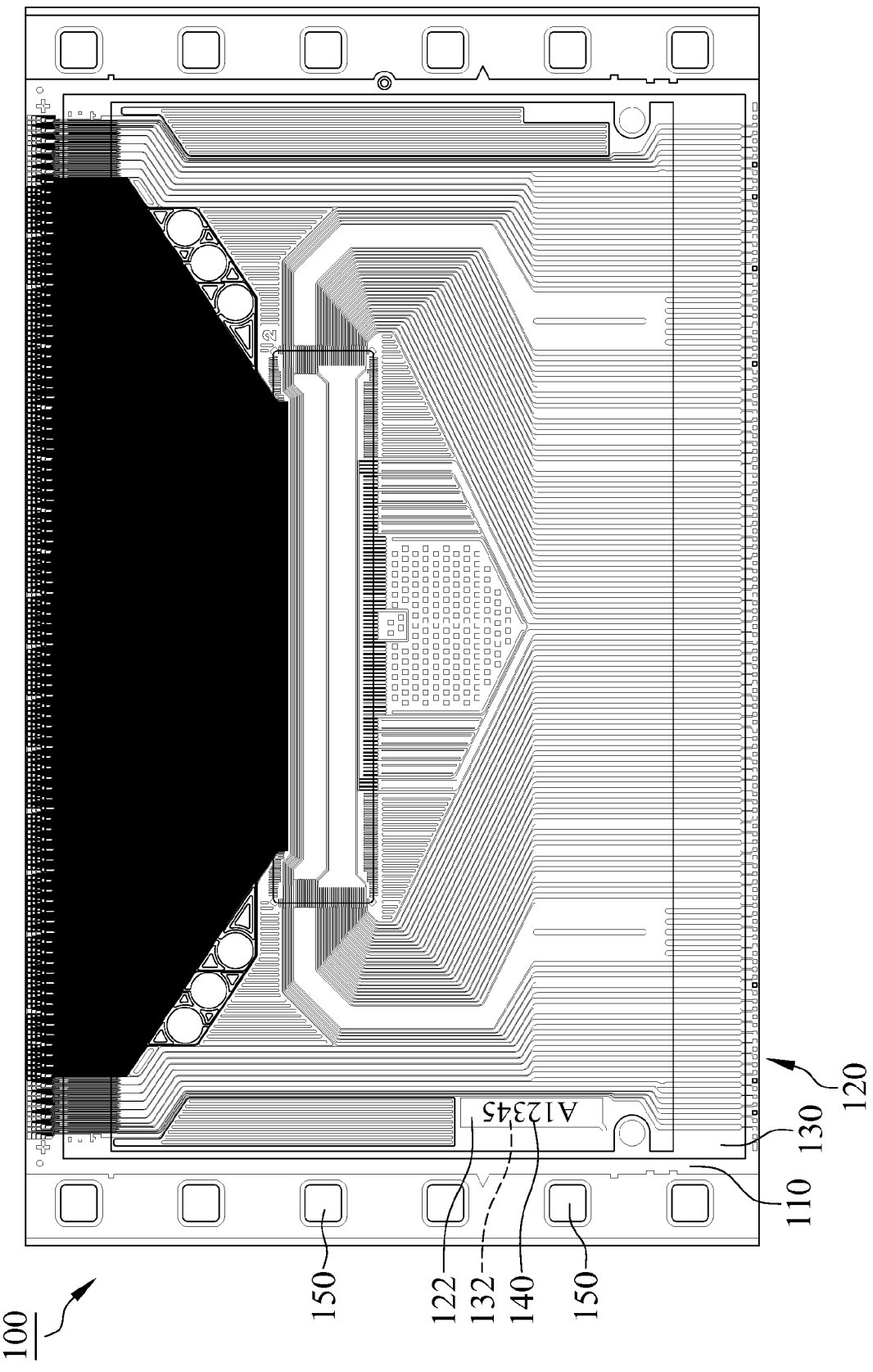
FIG. 1 is a top view illustrating a flexible substrate in accordance with a first embodiment of the present invention.

With reference to FIGS. 1, 2, 3 and 4, a flexible substrate 100 in accordance with a first embodiment of the present invention includes a base layer 110, a metallic layer 120, a solder mask layer 130, an identifying code 140 and a plurality of transmission holes 150. The base layer 110 comprises a first surface 111 and a second surface 112 opposite to the first surface 111. The transmission holes 150 are communicated with the first surface 111 and the second surface 112 of the base layer 110, arranged in order, and disposed at two sides of the base layer 110. The arrangement direction of the transmission holes 150 is the transmission direction of the flexible substrate 100, and each of the transmission holes 150 comprises a first area. The metallic layer 120 formed on the first surface 111 of the base layer 110 comprises a plurality of traces 121 and at least one bottom block 122 for defining marked position.

Figure 2:
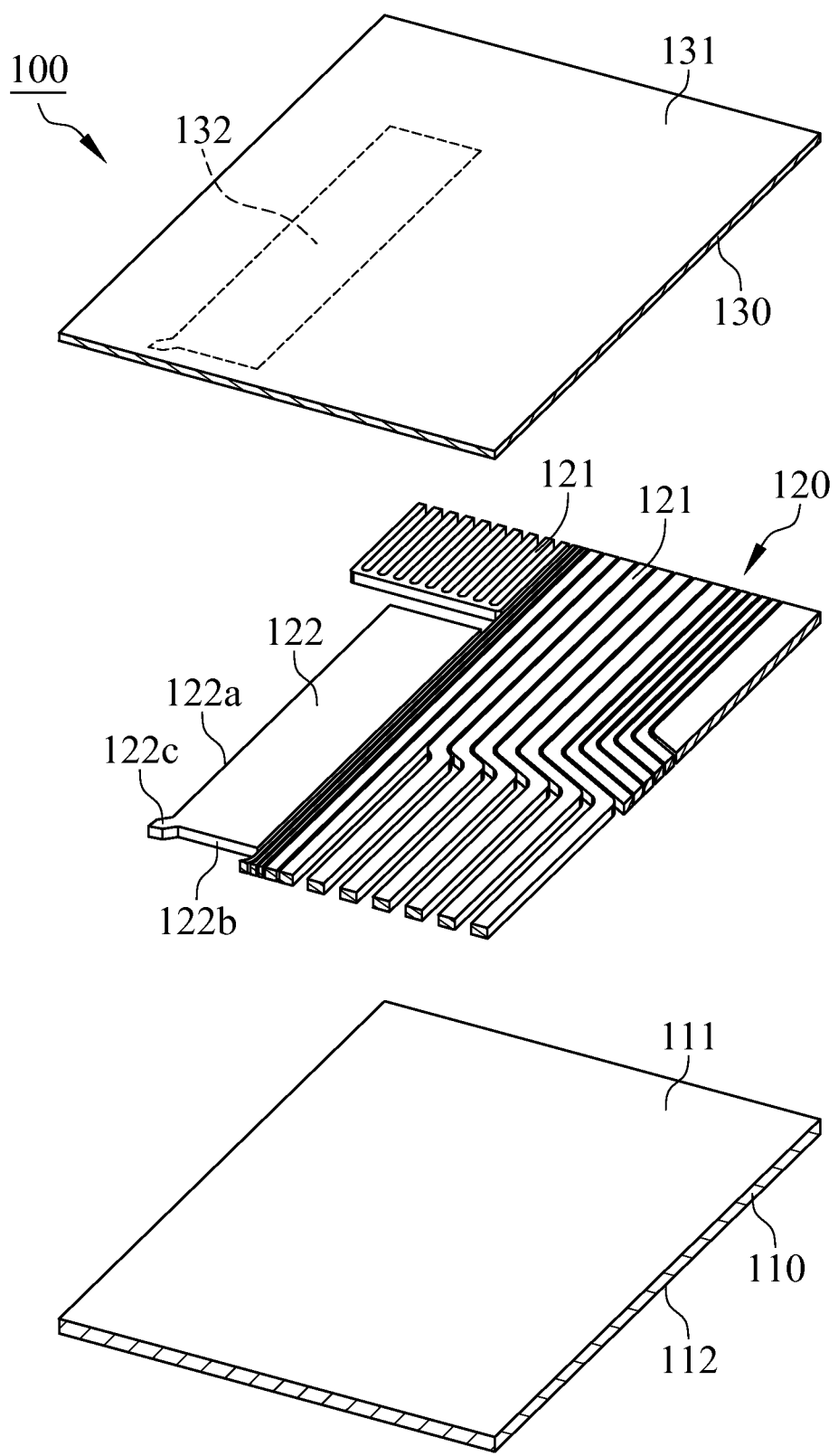
FIG. 2 is a partial perspective exploded diagram illustrating the flexible substrate in accordance with the first embodiment of the present invention.
Figure 4:
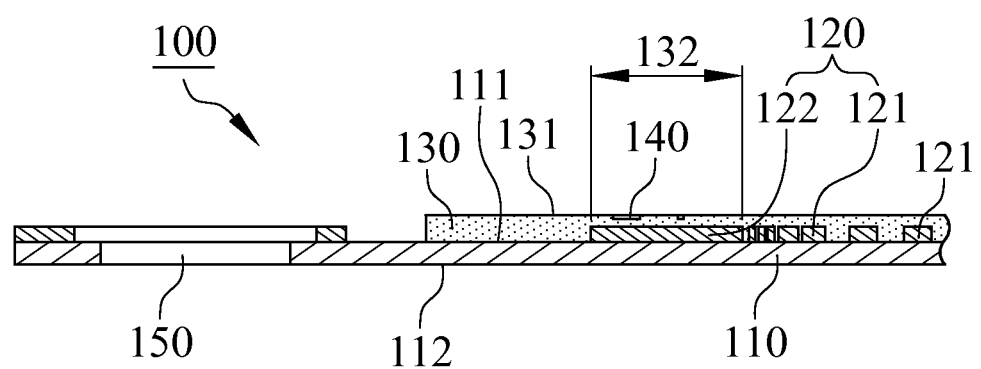
FIG. 4 is a partial section view illustrating the flexible substrate along A-A direction of FIG. 3 in accordance with the first embodiment of the present invention.

With reference to FIGS. 2 and 4, the traces 121 and the bottom block 122 are covered by the solder mask layer 130 to make the metallic layer 120 located between the base layer 110 and the solder mask layer 130. The solder mask layer 130 is made of a material that is pervious to light and comprises an exposing surface 131. A pre-marked area 132 is defined on the exposing surface 131 of the solder mask layer 130 and by an outlined edge of the bottom block 122. The pre-marked area 132 is located above the perpendicular direction of the bottom block 122 of the metallic layer 120. The range of the pre-marked area 132 is defined upon projection of outlined edge of the bottom block 122. In this embodiment, the shape of the pre-marked area 132 is the same with the shape of the bottom block 122.

Figure 3:
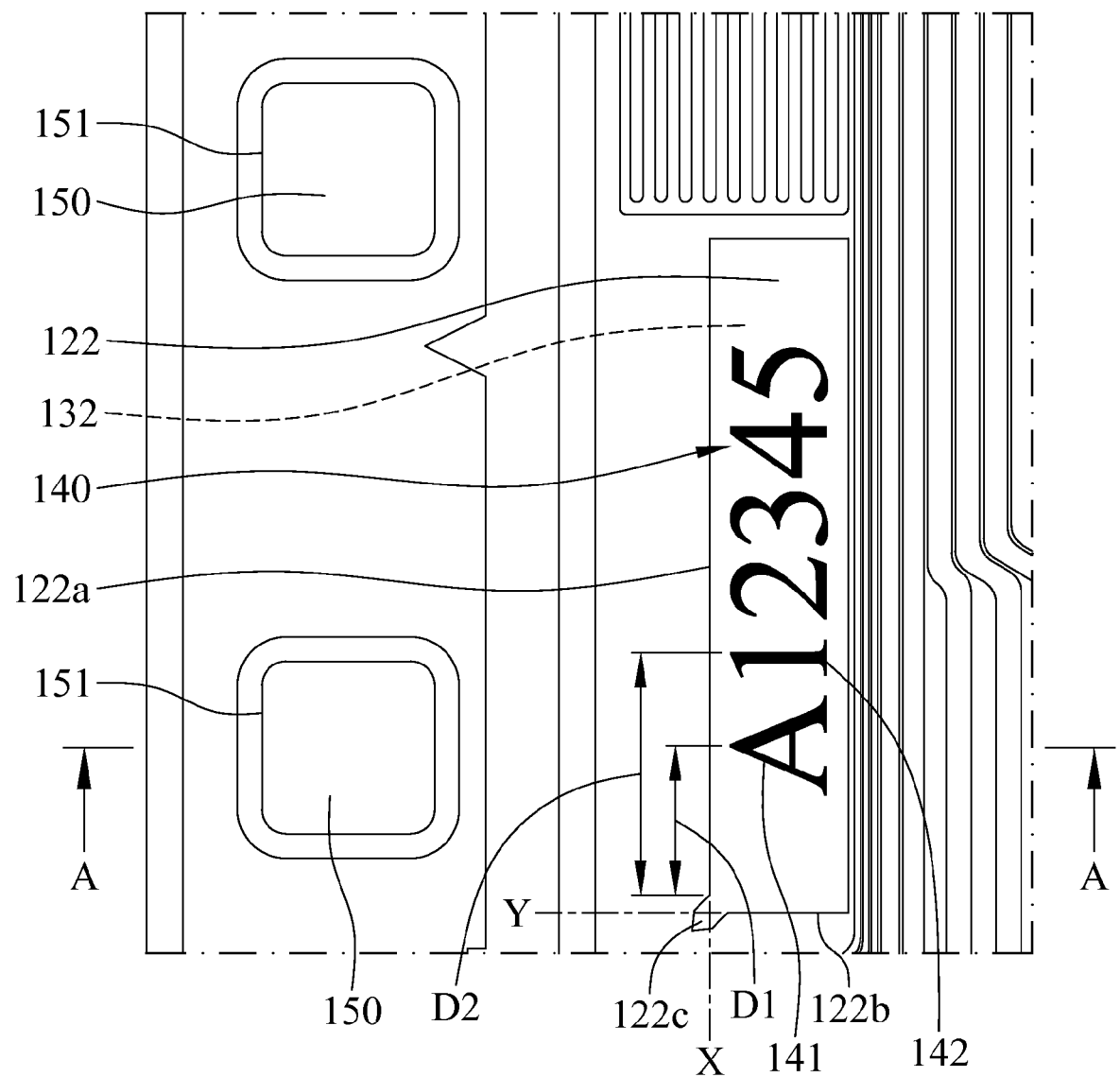
FIG. 3 is a partial enlargement diagram illustrating the flexible substrate in accordance with the first embodiment of the present invention.

With reference to FIGS. 1 and 3, in this embodiment, the bottom block 122 comprises a first longitudinal edge 122a, a lateral edge 122b and an initial identifying portion 122c, wherein a first extension line X of the first longitudinal edge 122a intersects with a second extension line Y of the lateral edge 122b, and the initial identifying position 122c is located at the intersection position of the first extension line X and the second extension line Y.

With reference to FIGS. 1, 2 and 4, for the solder mask layer 130 being material that is pervious to light and the pre-marked area 132 of the solder mask layer 130 defined upon projection of the outlined edge of the bottom block 122, therefore, the operator can easily interpret the position that is desired to be marked. In this embodiment, the identifying code 140 is formed within the pre-marked area 132 of the solder mask layer 130 by a laser apparatus (not shown in Figs.). Or in the other embodiment, the identifying code 140 is formed by printing or stamping.

With reference to FIGS. 2, 3 and 4, the identifying code 140 is formed within the pre-marked area 132 of the solder mask layer 130. In this embodiment, the identifying code 140 is a character string such as characters, numbers, patterns or combination of characters and numbers. Referring to FIG. 3, the character string includes a first character 141 and at least one second character 142, wherein a first horizontal distance D1 is defined between the first character 141 and the initial identifying portion 122c, a second horizontal distance D2 is defined between the at least one second character 142 and the initial identifying portion 122c, and the first horizontal distance D1 is smaller than the second horizontal distance D2. The initial identifying portion 122c is used for interpreting the initiation position of the first character 141 of the identifying code 140 to prevent manual interpretation or photography apparatus interpretation from wrong judgment.

With reference to FIGS. 1 and 3, the bottom block 122 comprises a second area larger than the first area of each of the transmission holes 150. Each of the transmission holes 150 comprises a second longitudinal edge 151 along with the arrangement direction of the transmission holes 150, the first longitudinal edge 122a of the bottom block 122 is larger than the second longitudinal edge 151, and the identifying code 140 is formed within the pre-marked area 132 of the solder mask layer 130 in accordance with the first longitudinal edge 122a. Therefore, when the identifying code 140 is a character string, the first longitudinal edge 122a of the bottom block 122 prevents the identifying code 140 from inclination as long as the identifying code 140 is formed. In addition, the first longitudinal edge 122a larger than the second longitudinal edge 151 prevents the characters of the character string from over crowd therefore avoiding wrong judgment of manual interpretation or photography apparatus interpretation.

Figure 5:
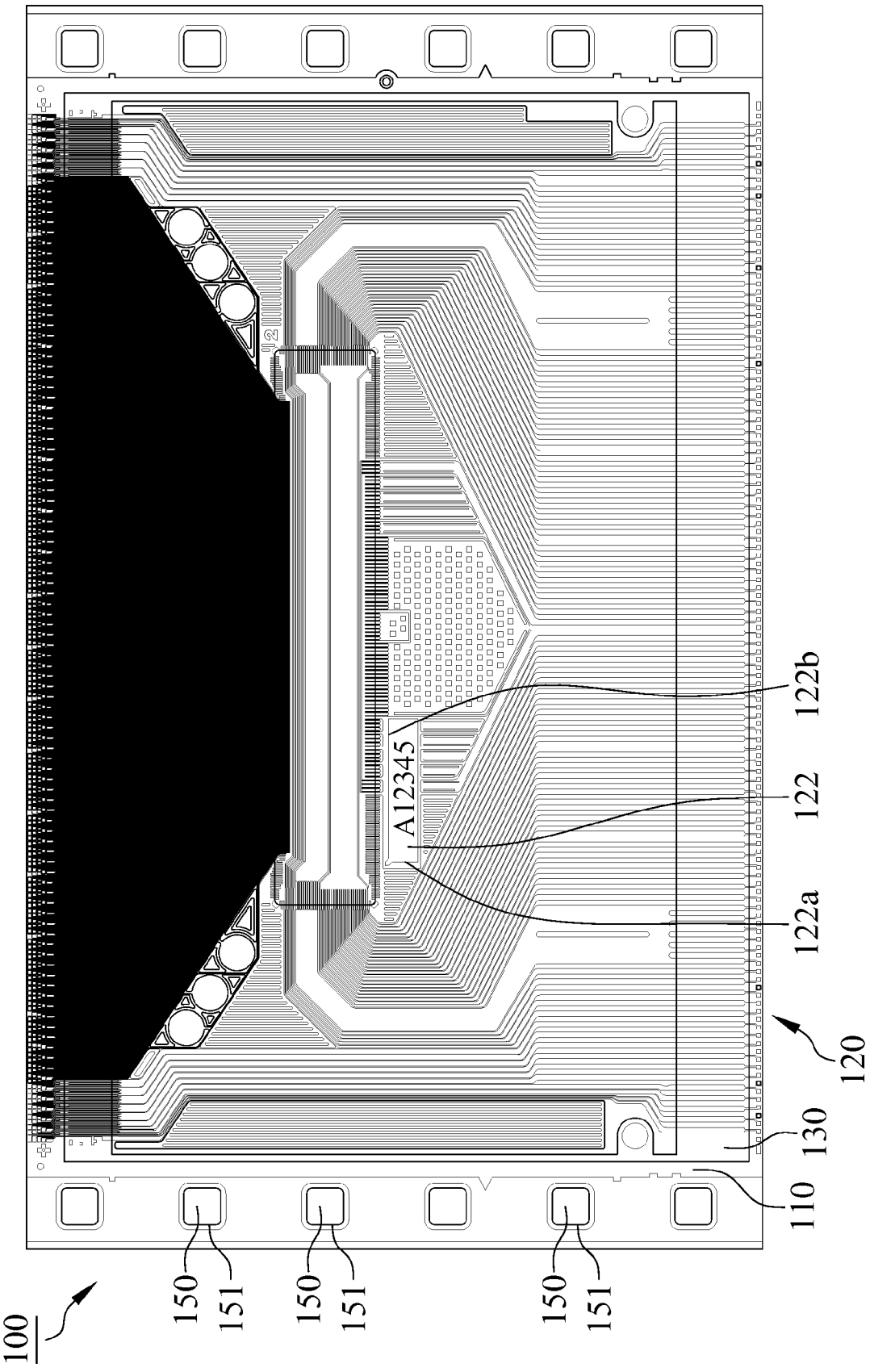
FIG. 5 is a top view illustrating a flexible substrate in accordance with a second embodiment of the present invention.
Figure 6:
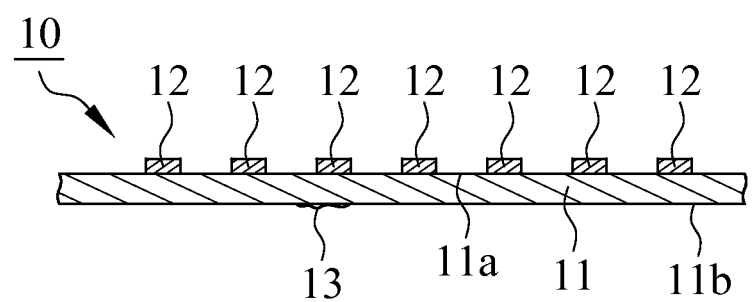
FIG. 6 is a partial section view illustrating a conventional flexible substrate.

A second embodiment of the present invention is illustrated in FIG. 5, the primary difference between the second embodiment and the first embodiment is that the lateral edge 122b of the bottom block 122 is larger than the second longitudinal edge 151 of each of the transmission holes 150 along the arrangement direction that is perpendicular to the transmission holes 150. The identifying code 140 is formed within the pre-marked area 132 of the solder mask layer 130 in accordance with the lateral edge 122b.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A flexible substrate includes: a base layer having a first surface and a second surface opposite to the first surface; a metallic layer formed on the first surface of the base layer, the metallic layer comprises a plurality of traces and at least one bottom block for defining marked position; a solder mask layer, wherein the solder mask layer is a material that is pervious to light and comprises an exposing surface, the traces and the at least one bottom block are covered with the solder mask layer, wherein a pre-marked area is defined on the exposing surface of the solder mask layer and by an outlined edge of the at least one bottom block, the pre-marked area is located above the perpendicular direction of the at least one bottom block of the metallic layer, and the range of the pre-marked area is defined by projection of the outlined edge of the at least one bottom block; and an identifying code formed within the pre-marked area of the solder mask layer, wherein the at least one bottom block comprises a first longitudinal edge, a lateral edge and an initial identifying portion, wherein a first extension line of the first longitudinal edge intersects with a second extension line of the lateral edge, and the initial identifying portion is located at the intersection position of the first extension line and the second extension line.

2. The flexible substrate in accordance with claim 1, wherein the shape of the pre-marked area is the same with the shape of the at least one bottom block.

3. The flexible substrate in accordance with claim 1, wherein the identifying code is a character string including a first character and at least one second character, wherein a first horizontal distance is defined between the first character and the initial identifying portion, a second horizontal distance is defined between the at least one second character and the initial identifying portion, and the first horizontal distance is smaller than the second horizontal distance.

4. The flexible substrate in accordance with claim 3 further includes a plurality of transmission holes communicating with the first surface and the second surface of the base layer, wherein the transmission holes are arranged in order and disposed at two sides of the base layer, each of the transmission holes comprises a first area, the at least one bottom block comprises a second area larger than the first area.

5. The flexible substrate in accordance with claim 4, wherein the arrangement direction of the transmission holes is the transmission direction of the flexible substrate, the at least one bottom block comprises a first longitudinal edge along with the arrangement direction of the transmission holes, each of the transmission holes comprises a second longitudinal edge along with the arrangement direction of the transmission holes, the first longitudinal edge is larger than the second longitudinal edge.

6. The flexible substrate in accordance with claim 4, wherein the arrangement direction of the transmission holes is the transmission direction of the flexible substrate, each of the transmission holes comprises a second longitudinal edge along with the arrangement direction of the transmission holes, the at least one bottom block comprises a lateral edge along with the direction perpendicular to the arrangement direction of the transmission holes, the lateral edge is larger than the second longitudinal edge.

7. The flexible substrate in accordance with claim 1 further includes a plurality of transmission holes communicating with the first surface and the second surface of the base layer, wherein the transmission holes are arranged in order and disposed at two sides of the base layer, each of the transmission holes comprises a first area, the at least one bottom block comprises a second area larger than the first area.

8. The flexible substrate in accordance with claim 7, wherein the arrangement direction of the transmission holes is the transmission direction of the flexible substrate, the at least one bottom block comprises a first longitudinal edge along with the arrangement direction of the transmission holes, each of the transmission holes comprises a second longitudinal edge along with the arrangement direction of the transmission holes, the first longitudinal edge is larger than the second longitudinal edge.

9. The flexible substrate in accordance with claim 7, wherein the arrangement direction of the transmission holes is the transmission direction of the flexible substrate, each of the transmission holes comprises a second longitudinal edge along with the arrangement direction of the transmission holes, the at least one bottom block comprises a lateral edge along with the direction perpendicular to the arrangement direction of the transmission holes, the lateral edge is larger than the second longitudinal edge.

\* \* \* \* \*